US005402011A

United States Patent [19]

Aoki

[11] Patent Number: 5,402,011

[45] Date of Patent: Mar. 28, 1995

[54] CURRENT SOURCE CIRCUIT

[75] Inventor: Hidehiko Aoki, Yokohama, Japan

[73] Assignee: Kabushiki Kaisha Toshiba, Kawasaki, Japan

[21] Appl. No.: 79,407

[22] Filed: Jun. 21, 1993

[30] Foreign Application Priority Data

Jun. 19, 1992 [JP] Japan .................................. 4-160568

[51] Int. Cl.[6] ............................................ H03K 3/35

[52] U.S. Cl. .................................. 327/635; 323/315; 327/530; 327/65

[58] Field of Search ............... 307/296.6, 296.1, 296.7, 307/356, 491, 494; 330/252; 323/315, 317

[56] References Cited

U.S. PATENT DOCUMENTS

| | | | |
|---|---|---|---|
| 4,359,653 | 11/1982 | Takamasa | 307/296.6 |
| 4,525,636 | 6/1985 | Kominami et al. | 307/494 |
| 4,577,119 | 3/1986 | Kim et al. | 307/296.6 |
| 4,691,174 | 9/1987 | Nelson et al. | 307/300 |
| 5,134,309 | 7/1992 | Matsumoto et al. | 307/494 |

OTHER PUBLICATIONS

Shoji, "Constant Current Circuit", Abstract of Japanese Patent Laid-Open No. 1-12705, (1989).

*Primary Examiner*—Timothy P. Callahan
*Assistant Examiner*—My-Trang Nu Ton
*Attorney, Agent, or Firm*—Foley & Lardner

[57] ABSTRACT

A small value current source circuit utilized in bipolar integrated circuits. A reference potential is level-shifted by a first level shift circuit and applied to one input of a differential amplifier. The reference potential is also level-shifted by a second level shift circuit and applied to the other input of the differential amplifier. A constant current source circuit supplies currents both proportional to the currents flowing in the differential amplifier and of mutually different values to the first and second level shift circuits. The differential amplifier amplifies the difference of the input voltages and produces an output current.

5 Claims, 6 Drawing Sheets

CURRENT SOURCE CIRCUIT

BACKGROUND OF THE INVENTION

1. Field of the Invention

The present invention relates to a current source circuit, in particular, to a minute current source circuit used by a bipolar IC (integrated circuit).

2. Description of Prior Art

A conventional and widely used minute current source is shown in FIG. 1. This is basically a current mirror and, as commonly known, the relationship between input and output is as follows.

$$I_{in}=I_{out}\exp\left(I_{out}R_1/V_t\right) \quad (1)$$

($V_t$=kT/q)

$V_t$: Thermal voltage k: Boltzmann's constant

T: Coupling temperature (°K.)

q: Electron quantum charge

For example, in order to obtain a 0.1 $\mu$A output current from a 10 $\mu$A input current, when coupling temperature T is a room temperature of appoximately 300° K., since the thermal voltage Vt is 26 mV, according to Formula 1, the value of resistance R1 becomes 1.2 MΩ. If this type of current mirror circuit is formed as part of an integrated circuit, as the resistance value increases, the space occupied by the resistance in the integrated circuit increases, while the resistance value accuracy declines. When these factors are considered, a resistance value of 1.2 MΩ is excessively high for forming part of an integrated circuit.

As can also be understood from Formula 1, the input/output relationship is not linear, and even when the temperature coefficient of resistance $R_1$ is taken as 0, a temperature factor exists. This condition is indicated in FIG. 2.

The circuit indicated in FIG. 3 is also well used. In this case, the input/output relationship is as follows.

$$I_{in}=I_{out}\exp\left(-I_{out}R_2/V_t\right) \quad (2)$$

Under the same temperature conditions as Formula 1, in order to obtain a 0.1 $\mu$A output current from a 10 $\mu$A input current, according to Formula 2, resistance $R_2$ is 12 KΩ. Although a high resistance, such as $R_1$ in FIG. 1, is not needed, as indicated in FIG. 4, the input/output relationship does not increase simply, but in the range of actual use as a minute current source, the relation is such that when the input current increases, the output current decreases. Also the resistance $R_2$ voltage drop increases, and when transistor Q1 enters saturation, the conditions of Formula 2 are no longer met and even when the temperature coefficient of resistance $R_2$ is taken as 0, a temperature factor exists.

As described above, in attempting to achieve a minute current source with the conventional circuit of FIG. 1, a high resistance is needed that is too large to incorporate into an IC, while the expanded chip size raises the cost. Resistance accuracy is also deficient. In the conventional circuit of FIG. 3, which seeks to avoid these problems, as the input current increases, the output current decreases. With respect to small input current variation, the output current variation is large, and there is risk of transistor saturation.

In addition, a common point of both the circuits of FIGS. 1 and 3 is that the input/output relationship is not linear, and an output current proportional to the input current cannot be obtained. As they also possess a temperature response, they have the disadvantage in that changes in temperature result in changes in output current.

SUMMARY OF THE INVENTION

An objective of the present invention is to provide a minute current source circuit that does not use the above mentioned resistance, possesses a linear input/output current relationship, and wherein this relationship does not have a temperature response.

A current source circuit in accordance with this invention comprises:

a differential amplifier that includes at least a first and a second transistor, for amplifying a difference in voltage applied to each transistor base, the voltage difference being output from a collector of said first transistor as an output current;

a first level shift circuit, including at least one first PN junction connected between a reference potential and said first transistor base, for level-shifting the reference potential to a first voltage drop produced across said first PN junction to apply the first voltage drop to said first transistor base;

a second level shift circuit, including second PN junction the number of which is equivalent to that of the first PN junction, connected between said reference potential and said second transistor base, for level-shifting the potential difference to a second voltage drop produced across said second PN junction to apply the second voltage drop to said second transistor base;

a first constant current circuit for supplying a first current proportional to the current flowing in said differential amplifier to said first level shift circuit; and a second constant current circuit for supplying a second current proportional to the current flowing in said differential amplifier and different from said first current to said second level shift circuit.

DETAILED DESCRIPTION OF THE PREFERRED EMBODIMENTS

Figure 1:
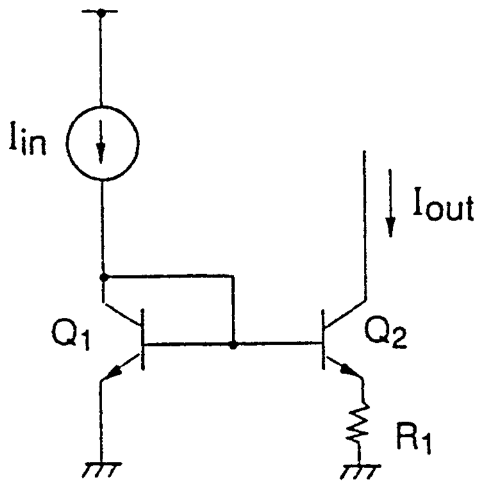
FIG. 1 PRIOR ART
FIG. 1 shows a conventional current source circuit.
Figure 2:
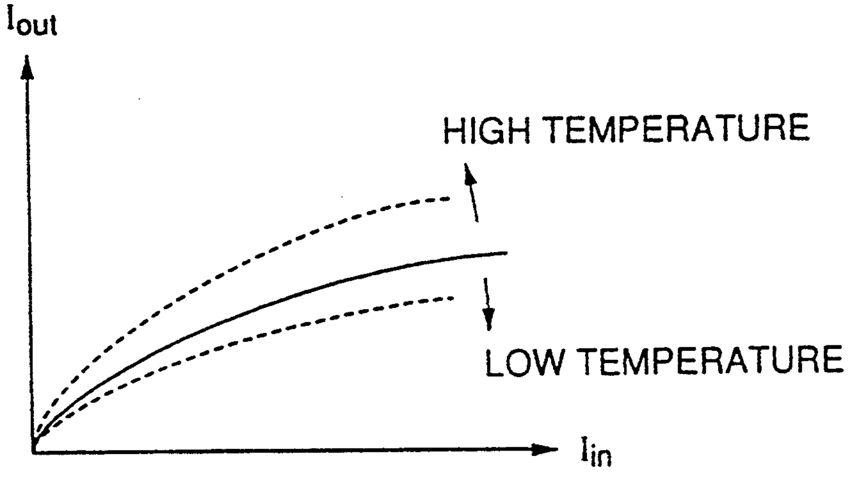
FIG. 2 PRIOR ART
FIG. 2 shows the current response of the conventional current source circuit shown in FIG. 1.
Figure 3:
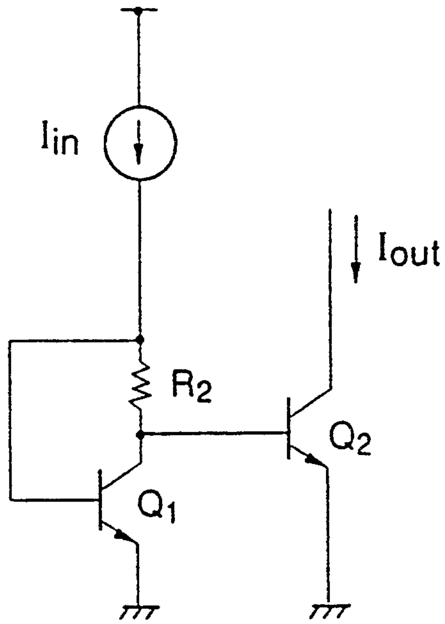
FIG. 3 PRIOR ART
FIG. 3 shows another conventional current source circuit.
Figure 4:
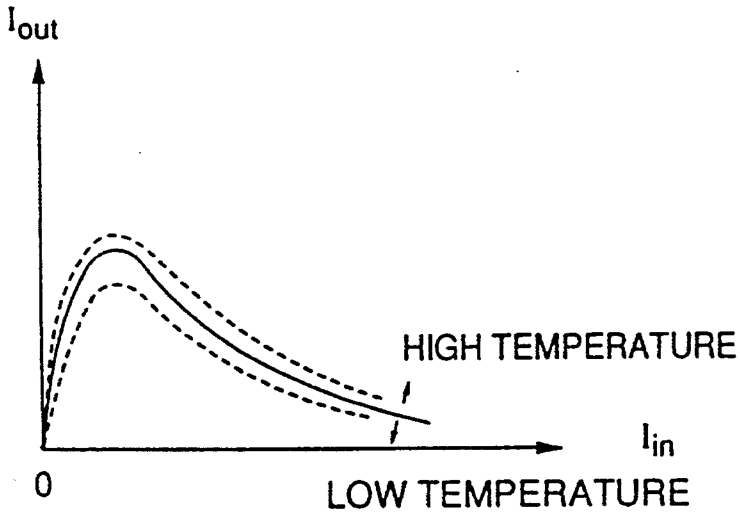
FIG. 4 PRIOR ART
FIG. 4 shows the current response of the conventional current source circuit shown in FIG. 3.
Figure 5:
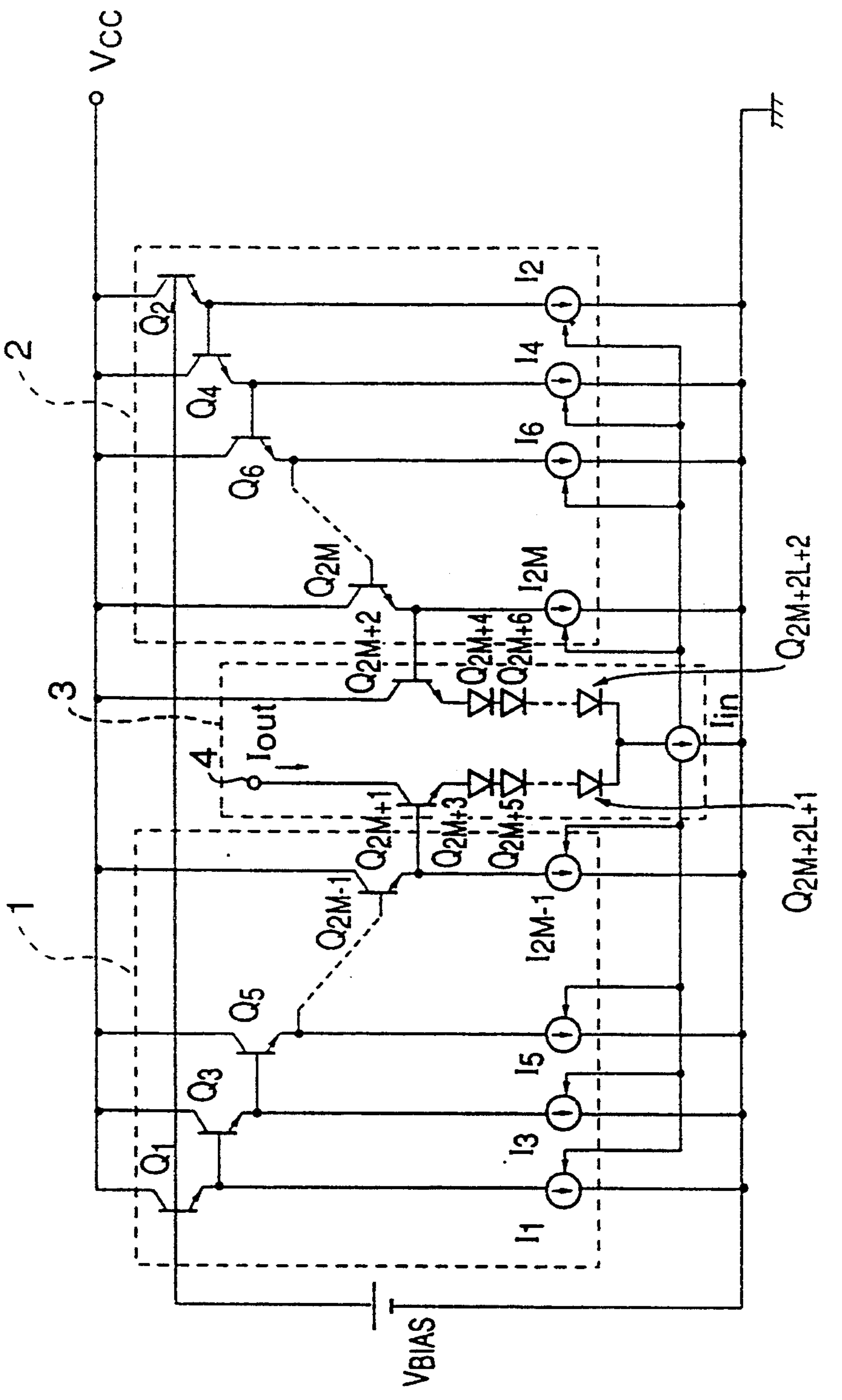
FIG. 5 shows a circuit in accordance with a first embodiment of this invention.

FIG. 5 indicates a first embodiment of this invention as a current source circuit. In FIG. 5, the base of a transistor $Q_1$ is connected to a reference voltage source $V_{bias}$, and the emitter of the transistor $Q_1$ is connected to the base of a transistor $Q_3$. Likewise, the emitter of transistor $Q_3$ is connected to the base of transistor $Q_5$. This configuration continues to a transistor $Q_{2M+1}$, with quantity M (M is an integral number of 1 or more) transistors consist of a Darlington circuit.

The respective emitters of the transistors $Q_1$, $Q_3$ . . . $Q_{2M-1}$ are connected to current sources $I_1$, $I_3$, . . . , $I_{2M-1}$. These transistors and current sources consist of a first level shift circuit 1.

Likewise, the respective emitters of the transistors $Q_2$, $Q_4$ . . . , $Q_{2M}$ are connected to current sources $I_2$, $I_4$, . . . , $I_{2M}$. These transistors and current sources consist of a second level shift circuit 2.

The base of a transistor $Q_{2M+1}$ is connected to the emitter of the transistor $Q_{2M-1}$, while the base of a transistor $Q_{2M+2}$ is connected to the emitter of the transistor $Q_{2M}$. The emitter of the transistor $Q_{2M+1}$ is connected via quantity L (L is an integral number greater than 0) of diodes $Q_{2M+3}-Q_{2M+2L+1}$ to a current source $I_{in}$, while the emitter of the transistor $Q_{2M}$ is connected via quantity L of diodes $Q_{2M+4}-Q_{2M+2L+2}$ to the current source $I_{in}$. These transistors, diodes and current source consist of a differential amplifier 3.

The outputs of these current sources $I_1$, $I_2$, . . . , $I_{2M}$ are proportional to the output of the current source $I_{in}$. The proportional constants of the current sources $I_1$, $I_2$, . . . , $I_{2M}$ with respect to the current source $I_{in}$ are $C_1$, $C_2$, . . . , $C_{2M}$ respectively.

The emitter area ratios of the transistors $Q_1$, $Q_2$, $Q_3$, $Q_4$, . . . , $Q_{M+1}$, $Q_{M+2}$ and diodes $Q_{2M+3}$, $Q_{2M+4}$, . . . , $Q_{2M+2L+1}$, $Q_{2M+2L+2}$ are respectively $N_1$, $N_2$, $N_3$, $N_4$, . . . , $N_{2M+1}$, $N_{2M+2}$ and $N_{2M+3}$, $N_{2M+4}$, . . . , $N_{2M+2L+1}$, $N_{2M+2L+2}$.

In accordance with the above mentioned circuit configuration, an output voltage of the reference voltage source $V_{bias}$ is level-shifted by the first level shift circuit 1 and applied to the base of the bipolar transistor $Q_{2M+1}$ of the differential amplifier circuit 3. The output voltage of the reference voltage $V_{bias}$ is also level-shifted by the second level shift circuit 2 and applied to the base of the bipolar transistor $Q_{2M+2}$ of the differential amplifier circuit 3.

A difference in current density arises according to each transistor emitter area ratio in the currents flowing through the first and second level shift circuits 1 and 2. This results in a difference in voltage applied to the bases of the two bipolar transistors $Q_{2M+1}$ and $Q_{2M+2}$ of the differential amplifier circuit 3, by which the collector currents of these bipolar transistors are controlled. A collector current $I_{out}$ of the transistor $Q_{2M+1}$ thus controlled then appears at an output terminal 4.

Following is a description of the operation of the circuit shown in FIG. 5.

As commonly known, the voltage $V_{be}$ between the base and emitter of a transistor can be expressed as $V_{be}=V_t\,I_n\,(I_c/N_iI_s)$, wherein $V_t$ is the thermal voltage, Ic is the collector current, N is the emitter area ratio, and $I_s$ is the collector saturation current.

In FIG. 5, the following voltage formula can be composed for the base-to-emitter closed circuit comprising the transistors $Q_1$, $Q_3$, . . . , $Q_{2M+1}$, diodes $Q_{2M+3}$, $Q_{2M+5}$, . . . , $Q_{2M+2L+1}$, $Q_{2M+2L+2}$, . . . , $Q_{2M+6}$, $Q_{2M+4}$, and transistors $Q_{2M+2}$, $Q_{2M}$, . . . , $Q_4$, $Q_2$.

$$-V_tI_n(I_c(Q_1)/N_1I_s) - V_tI_n(I_c(Q_3)/N_3I_s)\ldots \quad (3)$$

-continued $$-V_tI_n(I_c(Q_{2M+1})/N_{2M+1}I_s) - V_tI_n(I_c(Q_{2M+3})/N_{2M+3}I_s)\ldots$$
$$-V_tI_n(I_c(Q_{2M+2L+1})/N_{2M+2L+1}I_s) +$$
$$V_tI_n(I_c(Q_{2M+2L+2})/N_{2M+2L+2}I_s)\ldots +$$
$$V_tI_n(I_c(Q_{2M+4})/N_{2M+4}I_s) + V_tI_n(I_c(Q_{2M+2})/N_{2M+2}I_s)\ldots +$$
$$V_tI_n(I_c(Q_4)/N_4I_s) + V_tI_n(I_c(Q_2)/N_2I_s) = 0$$

A collector current $I_c$ flowing in each transistor of the first and second level shift circuit 1 and 2 is, because the proportional constants of the current sources connected to these transistors and with respect to the current source $I_n$ are respectively $C_1$, . . . , $C_{2M}$, expressed as follows.

$$I_c(Q_1)=C_1I_{in},\ I_c(Q_2)=C_2I_{in},\ I_c(Q_3)=C_3I_{in},$$
$$I_c(Q_4)=C_4I_{in},\ \ldots,\ I_c(Q_{2M-1})=C_{2M-1}I_{in},$$
$$I_c(Q_{2M})=C_{2M}I_{in} \quad (4)$$

Furthermore, the following relationships exist.

$$I_c(Q_{2M+1})=I_c(Q_{2M+3})=$$
$$\ldots=I_c(Q_{2M+2L+1})=I_{out}\ldots \quad (5)$$
$$I_c(Q_{2M+2})=I_c(Q_{2M+4})=$$
$$\ldots=I_c(Q_{2M+2L+2})=I_{in}-I_{out} \quad (6)$$

Therefore, $I_{out}$ can be derived from Formulas (3)-(6) as follows.

$$I_{out} = [1/\{1 + (NC)^{\frac{1}{L+1}}\}]I_{in} \quad (7)$$

In the above, $$N=(N_2{\cdot}N_4{\cdot}N_6\ldots N_{2M+2L+2})/(N_1\,N_3\,N_5\ldots N_{2M+2L+1}) \quad (8)$$

$$C=(C_1{\cdot}C_3{\cdot}C_5\ldots C_{2M-1})/(C_2{\cdot}C_4{\cdot}C_6\ldots C_{2M}) \quad (9)$$

In a minute current source, although it is necessary to set the $$1/\{1 + (NC)^{\frac{1}{L+1}}\}$$

of Formula (7) to a value sufficiently smaller than 1, from Formulas (8) and (9), it is fully possible to set N and C to values larger than 1, for example, to 100 or 1000. Also, since in an actual circuit, even a large value for L is less than 10, $$1/\{1 + (NC)^{\frac{1}{L+1}}\}$$

the value is sufficiently less than 1.

Figure 6:
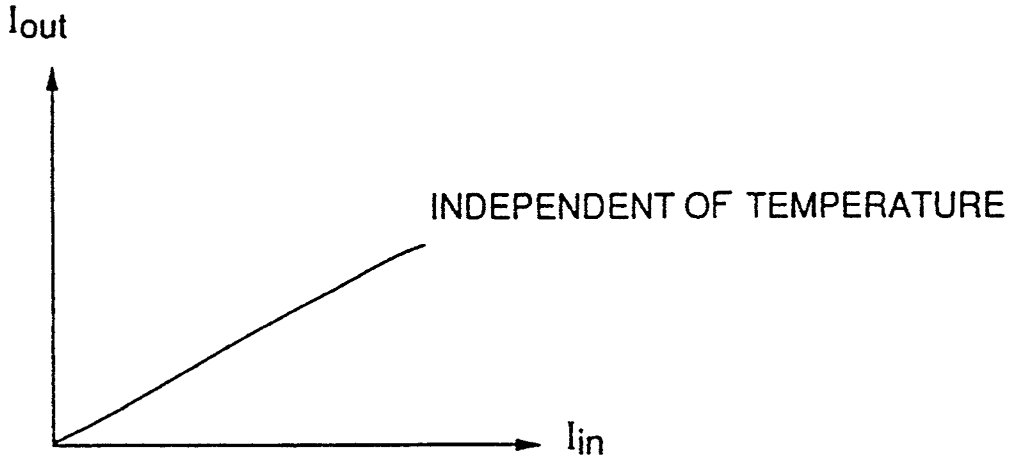
FIG. 6 shows the current response of the first embodiment of this invention.

As can be understood from Formula (7), the relationship between the input current $I_{in}$ and the output current $I_{out}$ is linear, and is completely independent of resistance and temperature. The input/output response of this circuit is as shown in FIG. 6.

Figure 7:
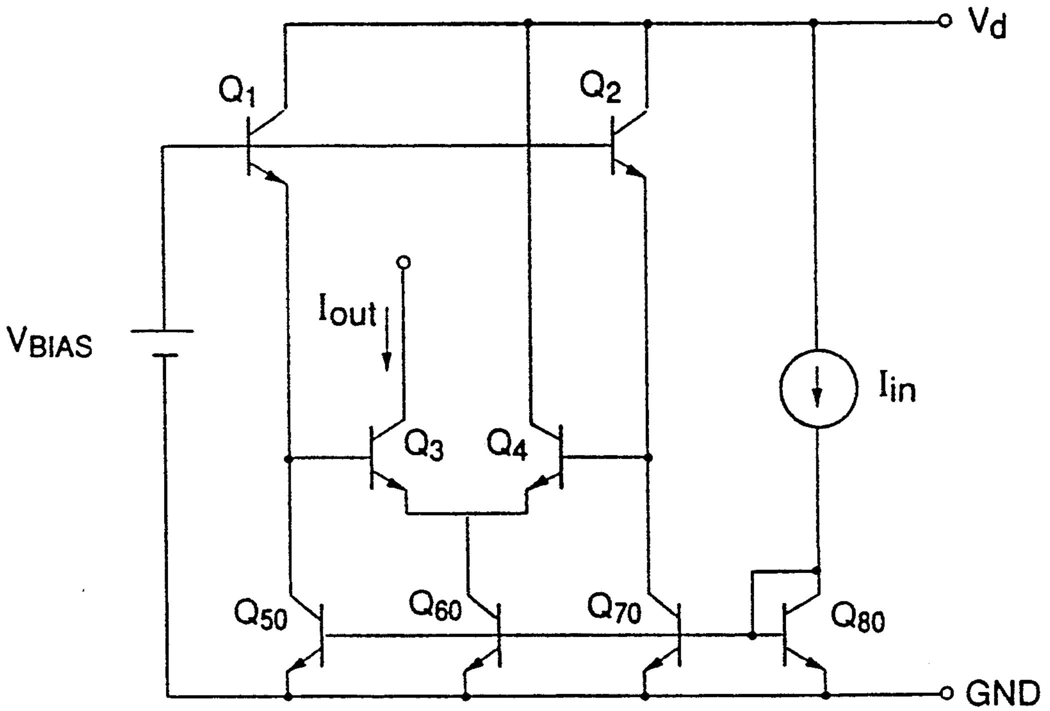
FIG. 7 shows a circuit in accordance with a second embodiment of this invention.

Next is a description of a second embodiment of this invention as a current source circuit with reference to FIG. 7.

With respect to FIG. 5, in the current source circuit of FIG. 7, L=0, M=1 and current sources comprise a current mirror circuit.

In this circuit, when the emitter area ratios of transistors $Q_1, \ldots, Q_4, Q_{50}, \ldots, Q_{80}$ are taken in sequence as $N_1$–$N_8$ and $N_6=N_8$, since $I_c(Q_{60})=I_{in}$, $M=1$ and $L=0$ can be substituted in Formulas (7) and (8) to yield the following relations.

$$I_{out}=\{1/(1+NC)\}I_{in} \quad (7\text{-}1)$$

$$N=(N_2 N_4)/(N_1 N_3) \quad (8\text{-}1)$$

$$C=C_1/C_2 \quad (9\text{-}1)$$

As $N_6=N_8=1$, and the relations of $C_1$ and $C_2$ are $C_1=N_5$ and $C_2=N_7$, the following is derived from Formula 9-1.

$$C=N_5/N_7 \quad (9\text{-}1')$$

Consolidating these formulas yields the following.

$$I_{out}=[1/\{1+(N_2 N_4 N_6)/(N_1 N_3 N_7\}]I_{in} \quad (10)$$

In the above, $N_6=N_8=1$. For example, when $N_1=N_3=N_6=N_7=N_8=1$ and $N_2=N_4=N_5=10$, $I_{out}=(1/1001)\ I_{in}$. The output current $I_{out}$ becomes 1/1001 the magnitude of the input current $I_{in}$. This output current is directly proportional to the input current and is independent of resistance or temperature factors.

Figure 8:
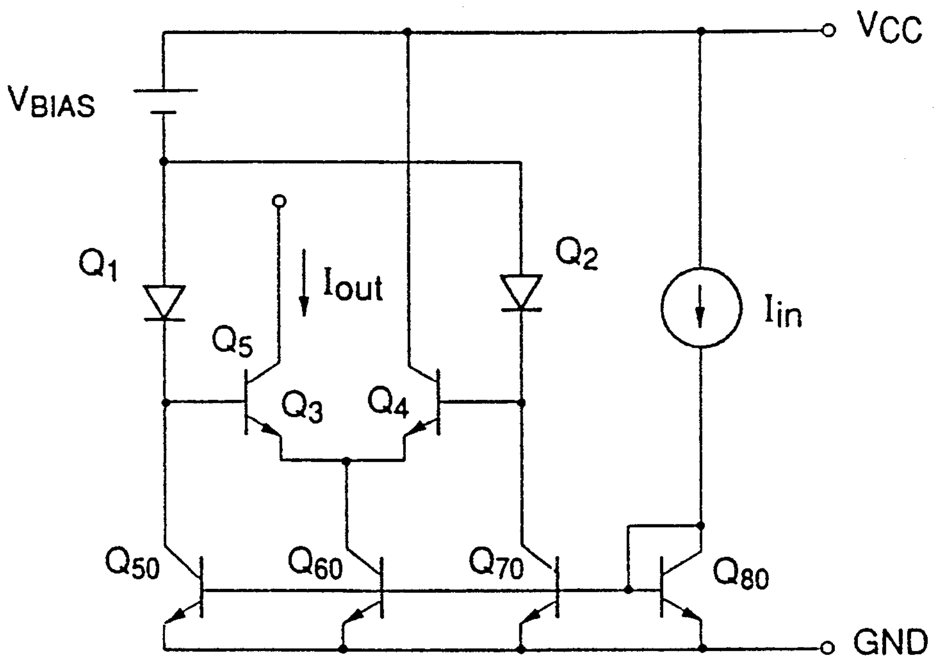
FIG. 8 shows a circuit in accordance with a third embodiment of this invention.

Following is a description of a third embodiment of this invention as a current source circuit with reference to FIG. 8.

Although $M=1$ and $L=0$ in the same manner as the FIG. 7 circuit, in the FIG. 8 circuit, transistors $Q_1$ and $Q_2$ are used as diodes. The basic operation is the same as the FIG. 5 circuit and in this case as well, with the $Q_1$–$Q_{80}$ emitter area ratio at $N_1$–$N_8$ as $N_6=N_8=1$, the conditions of Formula 10 are composed in the same manner as the FIG. 7 circuit.

Although in this case, both $Q_1$ and $Q_2$ are used as diodes, it is also possible to use only one of these as a diode. For example, if only $Q_1$ is a diode and $Q_2$ is a transistor, the emitter of the transistor $Q_2$ is connected to the base of the transistor $Q_4$, and the base of the transistor $Q_2$ is connected to the anode of the diode $Q_1$, and the collector of the transistor $Q_4$ is connected to the power source $V_{cc}$. This configuration as well forms the conditions applicable to Formula 10.

Figure 9:
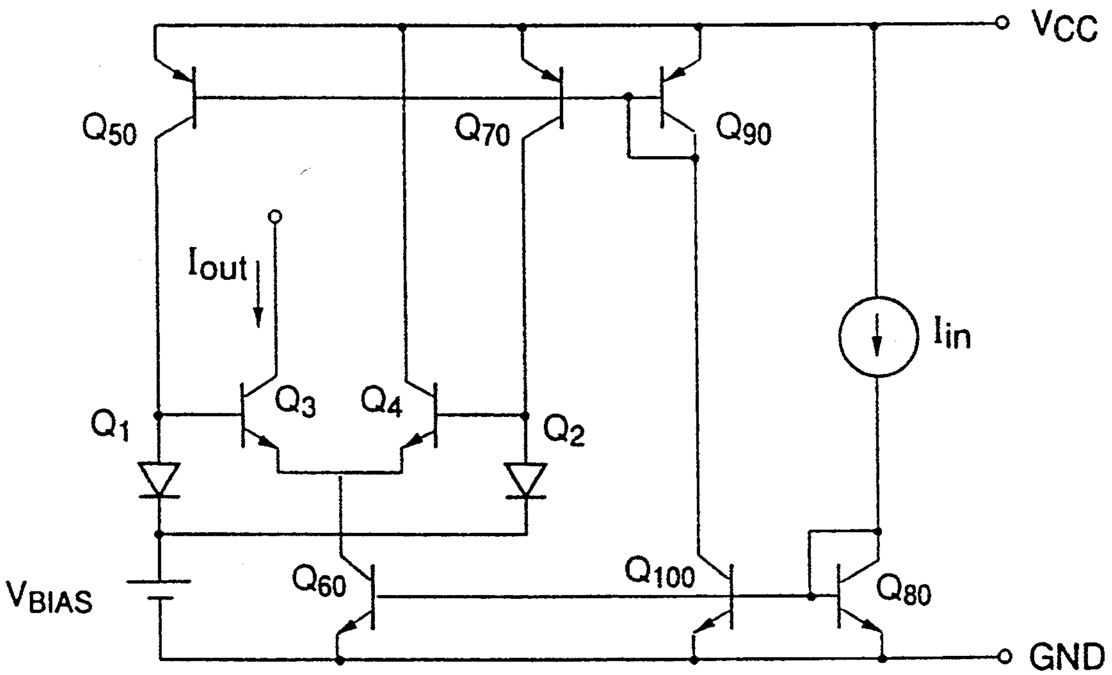
FIG. 9 shows a circuit in accordance with a fourth embodiment of this invention.

Next is a description of a fourth embodiment of this invention as a current source circuit with reference to FIG. 9.

In the FIG. 9 circuit, the polarities of the diodes $Q_1$ and $Q_2$ are reversed with respect to the FIG. 8 circuit and a current mirror circuit is provided in place of the reference voltage source $V_{bias}$. The emitter area ratio of diodes $Q_1$ and $Q_2$ and transistors $Q_3, \ldots, Q_{100}$ is taken in sequence as $N_1$–$N_{10}$.

In this case, the following voltage formula can be composed for the base-to-emitter closed circuit of diode $Q_1$, transistors $Q_3$ and $Q_4$, and diode $Q_2$.

$$V_t I_n(I_c(Q_1)/N_1 I_s)-V_t I_n(I_c(Q_3)/N_3 I_s)+$$

$$V_t I_n(I_c(Q_4)/N_4 I_s)-V_t I_n(I_c(Q_2)/N_2 I_s)=0 \quad (11)$$

The following formula also applies.

$$I_c(Q_1)=(N_5 N_{10}/N_8 N_9)I_{in},$$
$$I_c(Q_2)=(N_7 N_{10}/N_8 N_9)I_{in},$$

$$I_c(Q_3)=I_{out},\ I_c(Q_4)=I_c(Q_6)-I_{out},$$

$$I_c(Q_6)=(N_6/N_8)I_{in} \quad (12)$$

When $N_6=N_8=1$, $I_{out}$ can be derived from Formulas 11 and 12 as follows.

$$I_{out}=[1/\{1+(N_1 N_4 N_7/N_2 N_3 N_5)\}]I_{in} \quad (13)$$

As can be understood from comparing Formulas (13) and (10), although they differ in form, they are the same and yield the same results.

Figure 10:
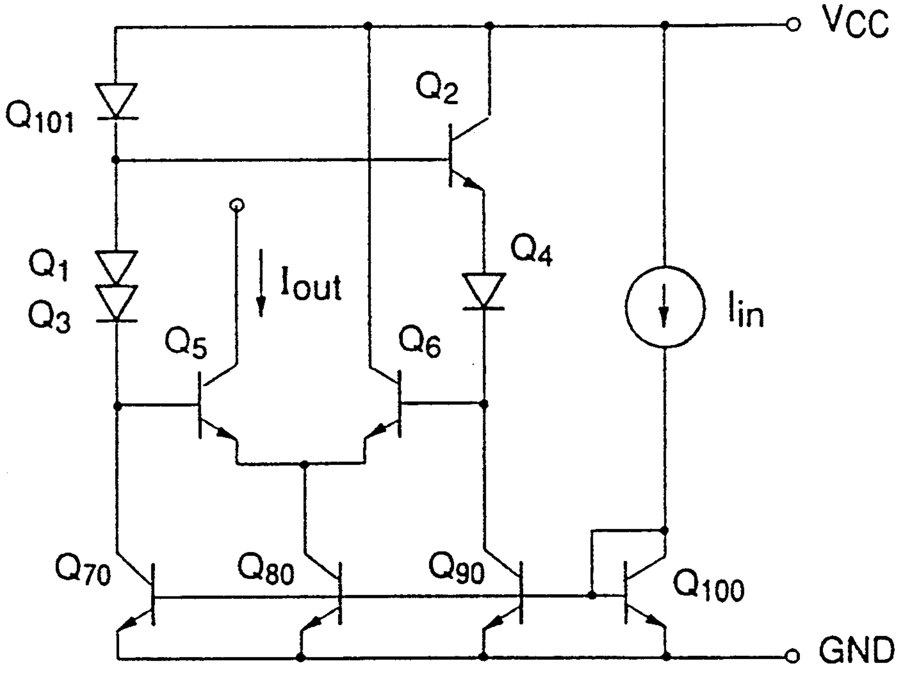
FIG. 10 shows a circuit in accordance with a fifth embodiment of this invention.

A fifth embodiment of this invention is shown in FIG. 10.

FIG. 10 is a case where $M=2$ and $L=0$, and a diode $Q_{101}$ is provided in place of the reference voltage source $V_{bias}$.

The diode $Q_{101}$ and transistor $Q_1, \ldots, Q_{100}$ area ratio is $N_1$–$N_{10}$ and when $N_8=N_{10}=1$, since $I_c(Q_{80})=I_{in}$, $M=2$ and $L=0$ can be substituted in Formulas (7) and (8) to yield the following.

$$I_{out}=\{1/(1+N_k)\}I_{in} \quad (7\text{-}2)$$

$$N=(N_2 N_4 N_6)/(N_1 N_3 N_5) \quad (8\text{-}2)$$

$$C=(C_1 C_3)/(C_2 C_4) \quad (9\text{-}2)$$

Since $N_8=N_{10}=1$, the relationship to $C_1$–$C_6$ is $C_1=C_3=N_7$, and $C_2=C_4=N_2$, the following is obtained from Formula 9-2.

$$C=(N_7/N_2)^2 \quad (9\text{-}2')$$

These formulas can be consolidated as follows.

$$I_{out}=[1/\{1+(N_2 N_4 N_6 N_7^2)/N_1 N_3 N_5 N_9^2)\}]I_{in} \quad (14)$$

In the above, $N_8=N_{10}=1$.

For example, when $N_1=N_3=N_5=N_8=N_9=N_{10}=1$, and $N_2=N_4=N_6=N_7=4$, $I_{out}=(1/1025)\ I_{in}$. The output current $I_{out}$ becomes 1/1025 the magnitude of the input current $I_{in}$, independently of resistance and temperature factors.

Figure 11:
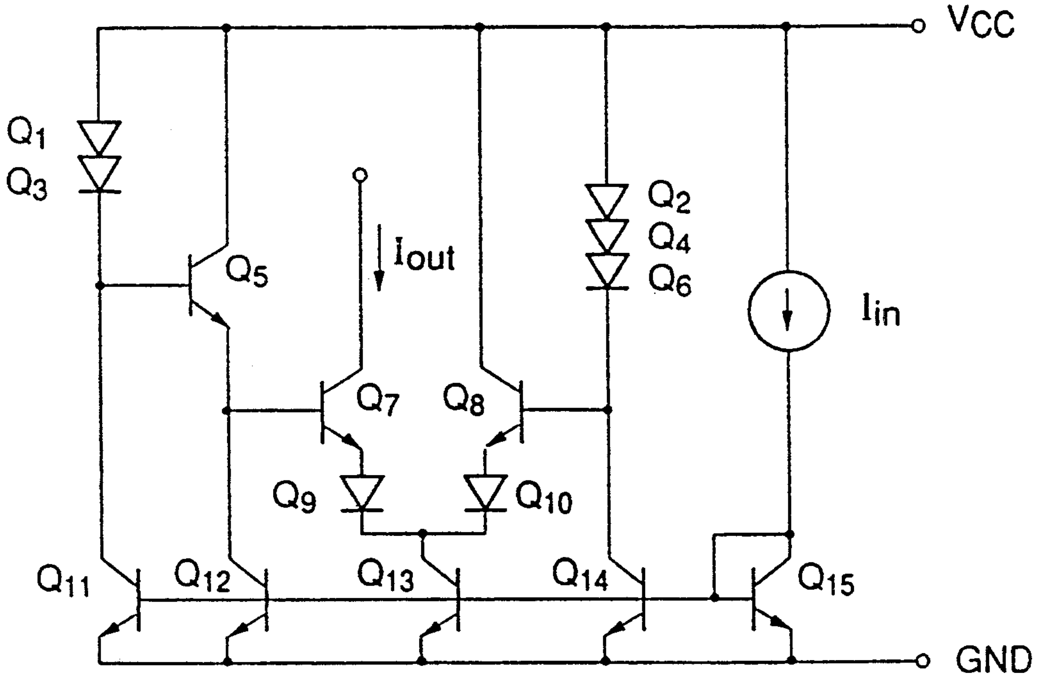
FIG. 11 shows a circuit in accordance with a sixth embodiment of this invention.

A sixth embodiment of this invention as a current source circuit is shown in FIG. 11. In the FIG. 11 example, $M=3$ and $L=1$, and the emitter area ratios of the diodes and transistors $Q_1$–$Q_{14}$ are $N_1$–$N_{14}$. When $N_{13}=N_{15}=1$, since $I_c(Q_{13})=I_{in}$, $M=3$ and $L=1$ can be substituted in Formulas (7) and (8) to yield the following.

$$I_{out}=\{1/(1+NC)\}I_{in} \quad (7\text{-}3)$$

$$N=(N_2 N_4 N_6 N_8 N_{10})/(N_1 N_3 N_5 N_7 N_9) \quad (8\text{-}3)$$

$$C=(C_1\cdot C_3\cdot C_5)/(C_2\cdot C_4\cdot C_6) \quad (9\text{-}3)$$

Since $N_{13}=N_{15}=1$, the relationship of $C_1$–$C_6$ is $C_1=C_3=N_{11}$, $C_5=N_{12}$ and $C_2=C_4=C_6=N_{14}$. The following is obtained from Formula (7-3).

$$k=N_{11}^2 N_{12}/N_{14}^3 \quad (9\text{-}3')$$

By consolidating these formulas, the following relationship is obtained.

$$I_{out}=[1/\{1+(N_2 N_4 N_6 N_8 N_{10} N_{11}^2 N_{12})/(N_1 N_3 N_5 N_7 N_9 N_{14}^3)\}]I_{in} \quad (15)$$

In the above, $N_{13}=N_{15}=1$.

The relationship between $I_{out}$ and $I_{in}$ is determined only by the emitter area ratio, independently of resistance and temperature.

As described in the foregoing, as a result of this invention, a current source circuit can be realized wherein the relationship between an input current and an output current is determined solely by the transistor area ratio and independently of the input/output current, resistance and temperature. Furthermore, since the input/output current relationship is linear, an output current proportional to the input current can be obtained. In addition, this advantage is realized even if the input current comprises a bias current and current variation component, thus enabling applications as a superbly linear current attenuator.

What is claimed is:

1. A current source circuit comprising:
- a differential amplifier including at least a first and a second transistor for amplifying a difference in voltage applied to each transistor base, the voltage difference being output from a collector of said first transistor as an output current;
- a first voltage control circuit including at least one first PN junction connected between a reference potential and said first transistor base, said reference potential being applied to said first PN junction to cause a first voltage drop across said PN junction, the first voltage drop being applied to said first transistor base;
- a second voltage control circuit including at least one second PN junction connected between said reference potential and said second transistor base, the reference potential being applied to said second PN junction to cause a second voltage drop across said second PN junction, the second voltage drop being applied to said second transistor base,
- wherein a first number of PN junctions including a PN junction of said first transistor and the PN junction included in said first voltage control circuit is equivalent to a second number of PN junctions including a PN junction of said second transistor and the PN junction included in said second voltage control circuit;
- a first constant current circuit for supplying a first current proportional to the output current flowing in said differential amplifier, to said first voltage control circuit; and
- a second constant current circuit for supplying a second current proportional to the output current flowing in said differential amplifier and different from said first current to said second voltage control circuit.

2. A current source circuit in accordance with claim 1 wherein
said first voltage control circuit comprises a plurality of PN junction stages.

3. A current source circuit in accordance with claim 1 wherein
a current density corresponding to said first voltage drop flowing in the PN junction of said first voltage control circuit is greater than a current density corresponding to said second voltage drop flowing in the PN junction of said second voltage control circuit.

4. A current source circuit in accordance with claim 1 wherein
an emitter area of said first transistor is different from an emitter area of said second transistor.

5. A current source circuit in accordance with claim 1 wherein
said first and second constant current circuits include current mirror circuits.

* * * * *